(12) United States Patent
Odnoblyudov et al.

(10) Patent No.: US 10,763,109 B2
(45) Date of Patent: *Sep. 1, 2020

(54) METHODS OF MANUFACTURING ENGINEERED SUBSTRATE STRUCTURES FOR POWER AND RF APPLICATIONS

(71) Applicant: QROMIS, Inc., Santa Clara, CA (US)

(72) Inventors: Vladimir Odnoblyudov, Danville, CA (US); Cem Basceri, Los Gatos, CA (US); Shari Farrens, Boise, ID (US)

(73) Assignee: Qromis, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/287,782

(22) Filed: Feb. 27, 2019

(65) Prior Publication Data

US 2019/0198311 A1    Jun. 27, 2019

Related U.S. Application Data

(62) Division of application No. 15/621,335, filed on Jun. 13, 2017, now Pat. No. 10,297,445.

(Continued)

(51) Int. Cl.
*H01L 21/02* (2006.01)
*H01L 21/8252* (2006.01)
(Continued)

(52) U.S. Cl.
CPC .......... *H01L 21/0242* (2013.01); *C23C 16/24* (2013.01); *C23C 16/303* (2013.01);
(Continued)

(58) Field of Classification Search
CPC .............. H01L 21/0242; H01L 21/743; H01L 21/0254; H01L 21/02532; H01L 21/0245;
(Continued)

(56) References Cited

U.S. PATENT DOCUMENTS 4,430,149 A    2/1984 Berkman
5,986,310 A    11/1999 Peng
(Continued)

OTHER PUBLICATIONS

International Search Report and Written Opinion of the International Searching Authority of corresponding International Application No. PCT/US2017/037252 dated Aug. 28, 2017 (18 pages).

(Continued)

*Primary Examiner* — Thinh T Nguyen
(74) *Attorney, Agent, or Firm* — Kilpatrick Townsend & Stockton LLP

(57) ABSTRACT

A method of manufacturing a substrate includes forming a support structure by providing a polycrystalline ceramic core, encapsulating the polycrystalline ceramic core in a first adhesion shell, encapsulating the first adhesion shell in a conductive shell, encapsulating the conductive shell in a second adhesion shell, and encapsulating the second adhesion shell in a barrier shell. The method also includes joining a bonding layer to the support structure, joining a substantially single crystalline silicon layer to the bonding layer, forming an epitaxial silicon layer by epitaxial growth on the substantially single crystalline silicon layer, and forming one or more epitaxial III-V layers by epitaxial growth on the epitaxial silicon layer.

10 Claims, 10 Drawing Sheets

Related U.S. Application Data

(60) Provisional application No. 62/350,084, filed on Jun. 14, 2016.

(51) Int. Cl.
| | |
|---|---|
| *H01L 29/20* | (2006.01) |
| *C30B 33/08* | (2006.01) |
| *H01L 21/74* | (2006.01) |
| *H01L 23/535* | (2006.01) |
| *C30B 29/06* | (2006.01) |
| *C30B 29/40* | (2006.01) |
| *C30B 29/68* | (2006.01) |
| *C23C 16/24* | (2006.01) |
| *C23C 16/34* | (2006.01) |
| *C30B 25/18* | (2006.01) |
| *C30B 33/06* | (2006.01) |
| *C23C 16/30* | (2006.01) |
| *H01L 29/778* | (2006.01) |
| *H01L 29/80* | (2006.01) |
| *H01L 21/762* | (2006.01) |

(52) U.S. Cl.
CPC ............ *C23C 16/345* (2013.01); *C30B 25/18* (2013.01); *C30B 29/06* (2013.01); *C30B 29/406* (2013.01); *C30B 29/68* (2013.01); *C30B 33/06* (2013.01); *C30B 33/08* (2013.01); *H01L 21/0245* (2013.01); *H01L 21/0254* (2013.01); *H01L 21/02428* (2013.01); *H01L 21/02488* (2013.01); *H01L 21/02491* (2013.01); *H01L 21/02505* (2013.01); *H01L 21/02532* (2013.01); *H01L 21/743* (2013.01); *H01L 21/8252* (2013.01); *H01L 23/535* (2013.01); *H01L 29/2003* (2013.01); *H01L 21/76254* (2013.01); *H01L 29/7783* (2013.01); *H01L 29/802* (2013.01)

(58) Field of Classification Search
CPC . H01L 29/2003; H01L 23/335; C23C 16/345; C30B 29/406
USPC ............... 438/60, 105, 931; 257/76, 77, 183
See application file for complete search history.

(56) References Cited

U.S. PATENT DOCUMENTS

| | | | |
|---|---|---|---|
| 6,328,796 | B1 | 12/2001 | Kub et al. |
| 8,709,901 | B1 | 4/2014 | Chang et al. |
| 9,997,353 | B1 | 6/2018 | Kumar et al. |
| 10,290,674 | B2 * | 5/2019 | Odnoblyudov et al. ..................... H01L 21/762 |
| 2005/0092235 | A1 | 5/2005 | Brabant et al. |
| 2007/0141770 | A1 | 6/2007 | Reber et al. |
| 2010/0006857 | A1 | 1/2010 | Letertre |
| 2011/0117726 | A1 | 5/2011 | Pinnington et al. |
| 2014/0021483 | A1 | 1/2014 | Chu et al. |
| 2014/0183442 | A1 | 7/2014 | Odnoblyudov et al. |
| 2014/0264719 | A1 | 9/2014 | Chou et al. |
| 2015/0090956 | A1 | 4/2015 | Coones et al. |
| 2018/0019120 | A1 | 1/2018 | Semond et al. |

OTHER PUBLICATIONS

First Action Interview Pilot Program Pre-Interview Communication dated Oct. 17, 2018 in related U.S. Appl. No. 15/621,335 (six pages)
Non-Final Office Action dated Feb. 6, 2019 in related U.S. Appl. No. 15/621,338 (20 pages).

\* cited by examiner

METHODS OF MANUFACTURING ENGINEERED SUBSTRATE STRUCTURES FOR POWER AND RF APPLICATIONS

CROSS-REFERENCES TO RELATED APPLICATIONS

This application is a divisional application of U.S. patent application Ser. No. 15/621,335 filed on Jun. 13, 2017, now U.S. Pat. No. 10,297,445, which claims benefit of U.S. Provisional Patent Application No. 62/350,084, filed on Jun. 14, 2016, entitled "ENGINEERED SUBSTRATE STRUCTURE FOR POWER AND RF APPLICATIONS," the disclosures of which are hereby incorporated by reference in their entirety for all purposes.

BACKGROUND OF THE INVENTION

Light-emitting diode (LED) structures are typically epitaxially grown on sapphire substrates. Many products currently use LED devices, including lighting, computer monitors, and other display devices.

The growth of gallium nitride based LED structures on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to engineered substrate structures. More specifically, the present invention relates to methods and systems suitable for use in epitaxial growth processes. Merely by way of example, the invention has been applied to a method and system for providing a substrate structure suitable for epitaxial growth that is characterized by a coefficient of thermal expansion (CTE) that is substantially matched to epitaxial layers grown thereon. The methods and techniques can be applied to a variety of semiconductor processing operations.

According to an embodiment of the present invention, a substrate is provided. The substrate includes a support structure comprising: a polycrystalline ceramic core; a first adhesion layer coupled to the polycrystalline ceramic core; a conductive layer coupled to the first adhesion layer; a second adhesion layer coupled to the conductive layer; and a barrier layer coupled to the second adhesion layer. The substrate also includes a silicon oxide layer coupled to the support structure, a substantially single crystalline silicon layer coupled to the silicon oxide layer, and an epitaxial III-V layer coupled to the substantially single crystalline silicon layer.

According to another embodiment of the present invention, a method of manufacturing a substrate is provided. The method includes forming a support structure by: providing a polycrystalline ceramic core; encapsulating the polycrystalline ceramic core in a first adhesion shell; encapsulating the first adhesion shell in a conductive shell; encapsulating the conductive shell in a second adhesion shell; and encapsulating the second adhesion shell in a barrier shell. The method also includes joining a bonding layer to the support structure, joining a substantially single crystalline silicon layer to the bonding layer, forming an epitaxial silicon layer by epitaxial growth on the substantially single crystalline silicon layer, and forming an epitaxial III-V layer by epitaxial growth on the epitaxial silicon layer.

According to a specific embodiment of the present invention, an engineered substrate structure is provided. The engineered substrate structure includes a support structure, a bonding layer coupled to the support structure, a substantially single crystalline silicon layer coupled to the bonding layer, and an epitaxial single crystal silicon layer coupled to the substantially single crystalline silicon layer. The support structure includes a polycrystalline ceramic core, a first adhesion layer coupled to the polycrystalline ceramic core, a conductive layer coupled to the first adhesion layer, a second adhesion layer coupled to the conductive layer, and a barrier shell coupled to the second adhesion layer.

Numerous benefits are achieved by way of the present invention over conventional techniques. For example, embodiments of the present invention provide an engineered substrate structure that is CTE matched to gallium nitride based epitaxial layers suitable for use in optical, electronic, and optoelectronic applications. Encapsulating layers utilized as components of the engineered substrate structure block diffusion of impurities present in central portions of the substrate from reaching the semiconductor processing environment in which the engineered substrate is utilized. The key properties associated with the substrate material, including the coefficient of thermal expansion, lattice mismatch, thermal stability, and shape control are engineered independently for an improved (e.g., an optimized) match with gallium nitride-based epitaxial and device layers, as well as with different device architectures and performance targets. Because substrate materials layers are integrated together in the conventional semiconductor fabrication processes, process integration is simplified. These and other embodiments of the invention along with many of its advantages and features are described in more detail in conjunction with the text below and attached figures.

DETAILED DESCRIPTION OF SPECIFIC EMBODIMENTS

Embodiments of the present invention relate to engineered substrate structures. More specifically, the present invention relates to methods and systems suitable for use in epitaxial growth processes. Merely by way of example, the invention has been applied to a method and system for providing a substrate structure suitable for epitaxial growth that is characterized by a coefficient of thermal expansion (CTE) that is substantially matched to epitaxial layers grown thereon. The methods and techniques can be applied to a variety of semiconductor processing operations.

Figure 1:
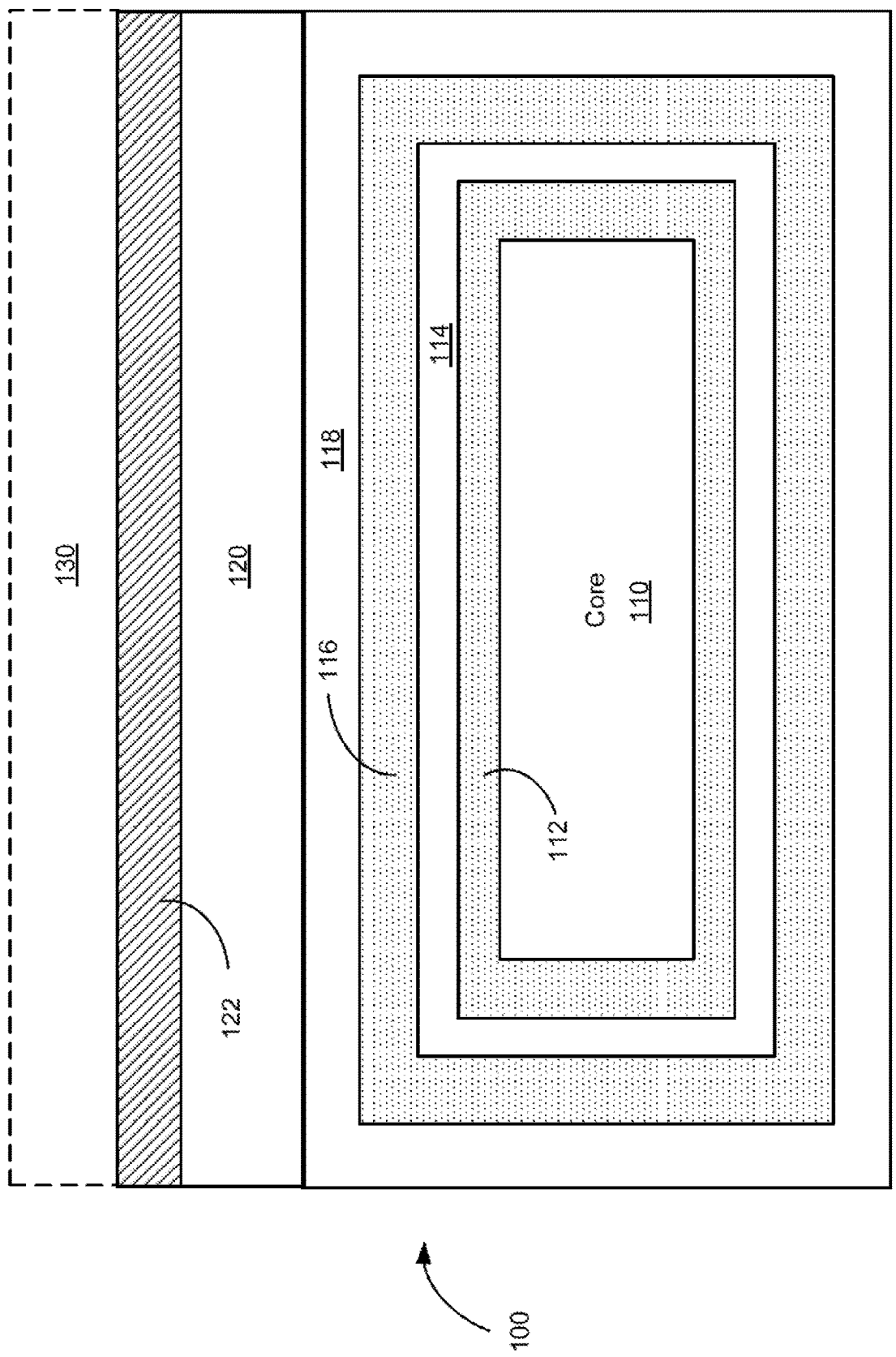
FIG. 1 is a simplified schematic diagram illustrating an engineered substrate structure according to an embodiment of the present invention.

FIG. 1 is a simplified schematic diagram illustrating an engineered substrate structure according to an embodiment of the present invention. The engineered substrate 100 illustrated in FIG. 1 is suitable for a variety of electronic and optical applications. The engineered substrate includes a core 110 that can have a coefficient of thermal expansion (CTE) that is substantially matched to the CTE of the epitaxial material that will be grown on the engineered substrate 100. Epitaxial material 130 is illustrated as optional because it is not required as an element of the engineered substrate, but will typically be grown on the engineered substrate.

For applications including the growth of gallium nitride (GaN)-based materials (epitaxial layers including GaN-based layers), the core 110 can be a polycrystalline ceramic material, for example, polycrystalline aluminum nitride (AlN), which can include a binding material such as yttrium oxide. Other materials can be utilized in the core 110, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core can be on the order of 100 to 1,500 µm, for example, 725 µm. The core 110 is encapsulated in a first adhesion layer 112 that can be referred to as a shell or an encapsulating shell. In an embodiment, the first adhesion layer 112 comprises a tetraethyl orthosilicate (TEOS) layer on the order of 1,000 Å in thickness. In other embodiments, the thickness of the first adhesion layer varies, for example, from 100 Å to 2,000 Å. Although TEOS is utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The first adhesion layer 112 completely surrounds the core 110 in some embodiments to form a fully encapsulated core and can be formed using an LPCVD process. The first adhesion layer 112 provides a surface on which subsequent layers adhere to form elements of the engineered substrate structure.

In addition to the use of LPCVD processes, furnace-based processes, and the like to form the encapsulating first adhesion layer, other semiconductor processes can be utilized according to embodiments of the present invention, including CVD processes or similar deposition processes. As an example, a deposition process that coats a portion of the core can be utilized, the core can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer 114 is a shell of polysilicon (i.e., polycrystalline silicon) that is formed surrounding the first adhesion layer 112 since polysilicon can exhibit poor adhesion to ceramic materials. In embodiments in which the conductive layer is polysilicon, the thickness of the polysilicon layer can be on the order of 500-5,000 Å, for example, 2,500 Å. In some embodiments, the polysilicon layer can be formed as a shell to completely surround the first adhesion layer 112 (e.g., a TEOS layer), thereby forming a fully encapsulated first adhesion layer, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a p-type polysilicon layer. In some embodiments, the doping with boron is at a level of $1\times10^{19}$ cm$^{-3}$ to $1\times10^{20}$ cm$^{-3}$ to provide for high conductivity. Other dopants at different dopant concentrations (e.g., phosphorus, arsenic, bismuth, or the like at dopant concentrations ranging from $1\times10^{16}$ cm$^{-3}$ to $5\times10^{18}$ cm$^{-3}$) can be utilized to provide either n-type or p-type semiconductor materials suitable for use in the conductive layer. One of ordinary skill in the art would recognize many variations, modifications, and alternatives.

The presence of the conductive layer 114 is useful during electrostatic chucking of the engineered substrate to semiconductor processing tools, for example tools with electrostatic chucks (ESC). The conductive layer 114 enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

A second adhesion layer 116 (e.g., a TEOS layer on the order of 1,000 Å in thickness) 116 is formed surrounding the conductive layer 114. The second adhesion layer 116 completely surrounds the conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer 118 that is on the order of 2,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer 118 comprises a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 118, e.g., a silicon nitride layer, prevents diffusion and/or outgassing of elements present in the core 110, for example, yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Figure 2A:
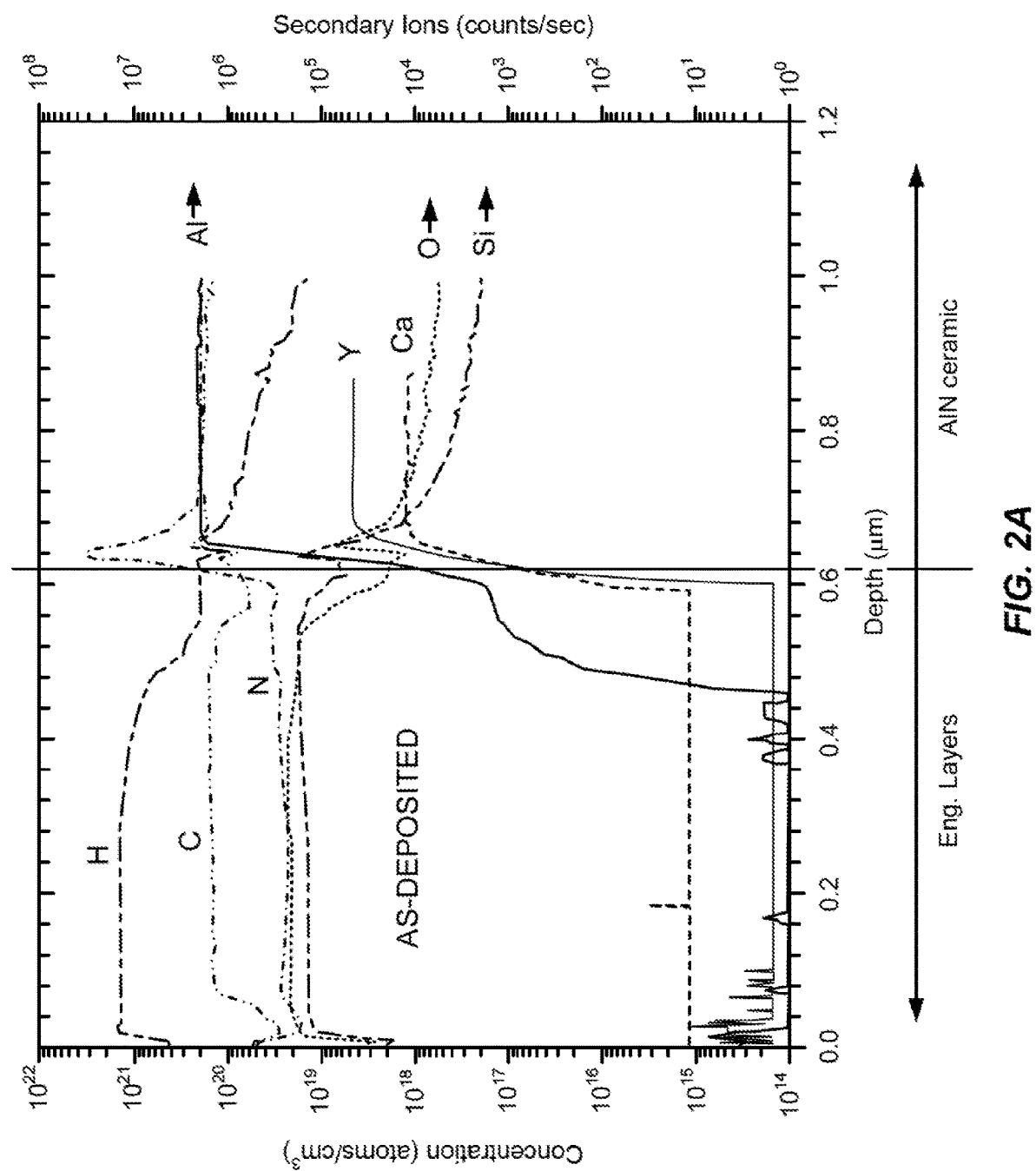
FIG. 2A is a SIMS profile illustrating species concentration as a function of depth for an engineered structure according to an embodiment of the present invention.

FIG. 2A is a secondary ion mass spectroscopy (SIMS) profile illustrating species concentration as a function of depth for an engineered structure according to an embodiment of the present invention. The engineered structure did not include barrier layer 118. Referring to FIG. 2A, several species present in the ceramic core (e.g., yttrium, calcium, and aluminum) drop to negligible concentrations in the engineered layers 120/122. The concentrations of calcium, yttrium, and aluminum drop by three, four, and six orders of magnitude, respectively.

Figure 2B:
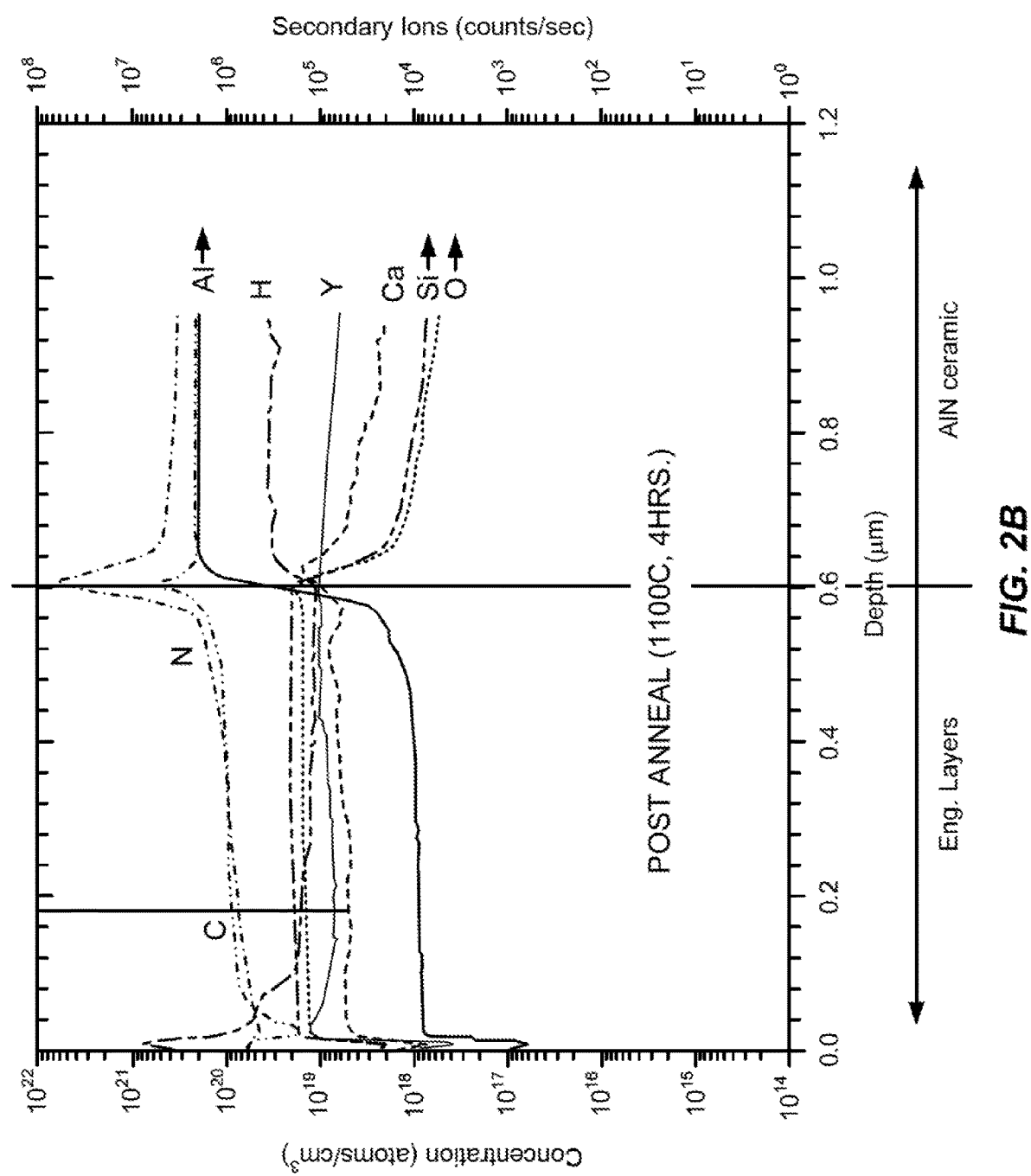
FIG. 2B is a SIMS profile illustrating species concentration as a function of depth for an engineered structure after anneal according to an embodiment of the present invention.

FIG. 2B is a SIMS profile illustrating species concentration as a function of depth for an engineered structure without a barrier layer after anneal according to an embodiment of the present invention. As discussed above, during semiconductor processing operations, the engineered substrate structures provided by embodiments of the present invention can be exposed to high temperatures (~1,100° C.) for several hours, for example, during epitaxial growth of GaN-based layers.

For the profile illustrated in FIG. 2B, the engineered substrate structure was annealed at 1,100° C. for a period of four hours. As shown by FIG. 2B, calcium, yttrium, and aluminum, originally present in low concentrations in the as deposited sample, have diffused into the engineered layers, reaching concentrations similar to other elements.

Figure 2C:
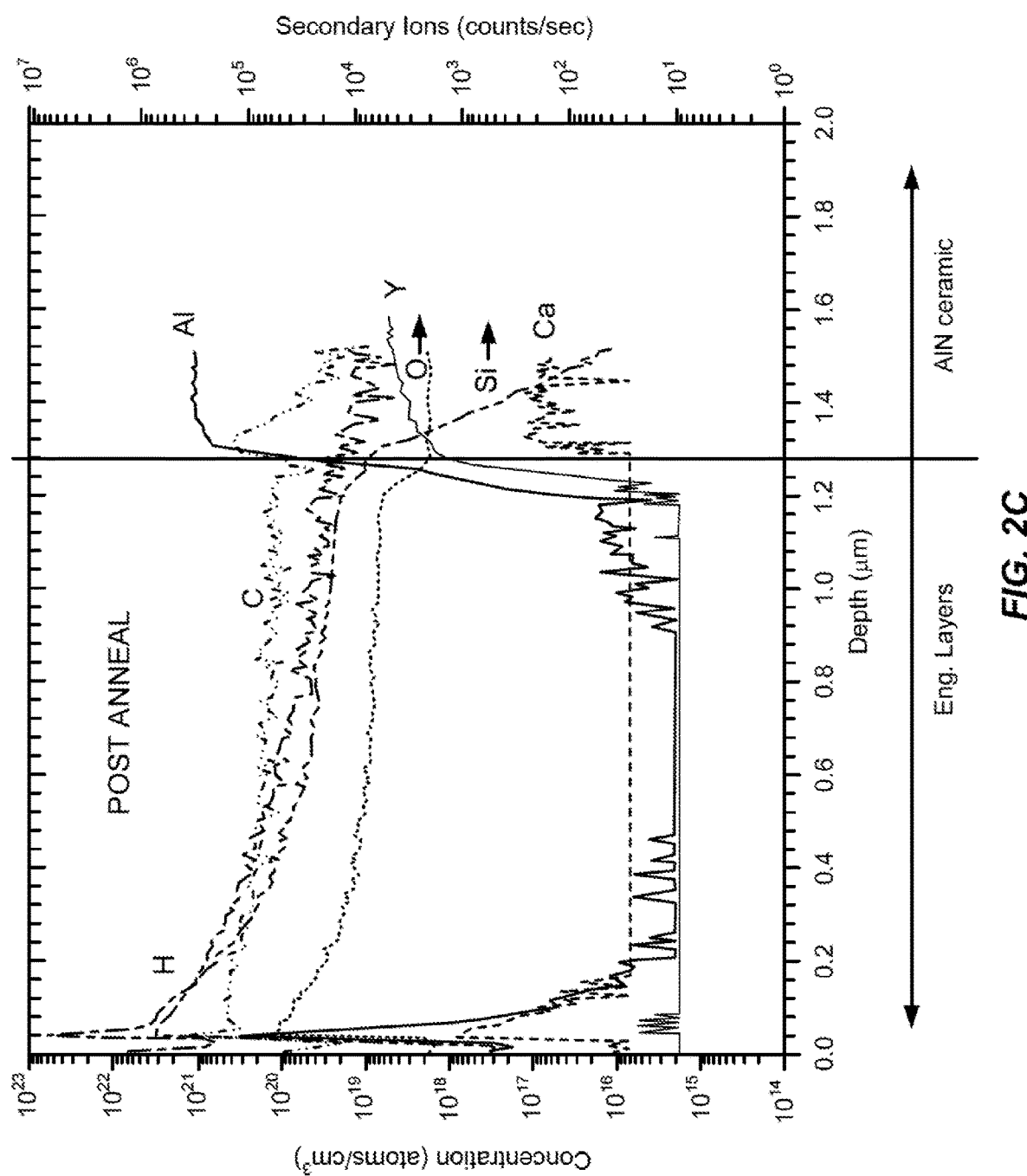
FIG. 2C is a SIMS profile illustrating species concentration as a function of depth for an engineered structure with a silicon nitride layer after anneal according to an embodiment of the present invention.

FIG. 2C is a SIMS profile illustrating species concentration as a function of depth for an engineered structure with a barrier layer after anneal according to an embodiment of the present invention. The integration of the diffusion barrier layer 118 (e.g., a silicon nitride layer) into the engineered substrate structure prevents the diffusion of calcium, yttrium, and aluminum into the engineered layers during the annealing process that occurred when the diffusion barrier layer was not present. As illustrated in FIG. 2C, calcium, yttrium, and aluminum present in the ceramic core remain at low concentrations in the engineered layers post-anneal. Thus, the use of the barrier layer 118 (e.g., a silicon nitride layer) prevents these elements from diffusing through the diffusion barrier and thereby prevents their release into the environment surrounding the engineered substrate. Similarly, any other impurities contained within the bulk ceramic material would be contained by the barrier layer.

Typically, ceramic materials utilized to form the core 110 are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate can occur. Thus, embodiments of the present invention integrate a barrier layer 118 (e.g., a silicon nitride layer) to prevent out-diffusion of the background elements from the polycrystalline ceramic material (e.g., AlN) into the engineered layers 120/122 and epitaxial layers such as optional GaN layer 130. The silicon nitride layer 118 encapsulating the underlying layers and material provides the desired barrier layer functionality.

As illustrated in FIG. 2B, elements originally present in the core 110, including yttrium diffuse into and through the first TEOS layer 112, the polysilicon layer 114, and the second TEOS layer 116. However, the presence of the silicon nitride layer 118 prevents these elements from diffusing through the silicon nitride layer and thereby prevents their release into the environment surrounding the engineered substrate, as illustrated in FIG. 2C.

Referring once again to FIG. 1, a bonding layer 120 (e.g., a silicon oxide layer) is deposited on a portion of the barrier layer 118, for example, the top surface of the barrier layer, and subsequently used during the bonding of a substantially single crystal silicon layer 122. The bonding layer 120 can be approximately 1.5 µm in thickness in some embodiments.

The substantially single crystalline layer 122 is suitable for use as a growth layer during an epitaxial growth process for the formation of epitaxial material 130. In some embodiments, the epitaxial material 130 includes a GaN layer 2 µm to 10 µm in thickness, which can be utilized as one of a plurality of layers utilized in optoelectronic devices, RF devices, power devices, and the like. In an embodiment, the substantially single crystalline layer 122 includes a substantially single crystalline silicon layer that is attached to the silicon oxide layer 118 using a layer transfer process.

Figure 3:
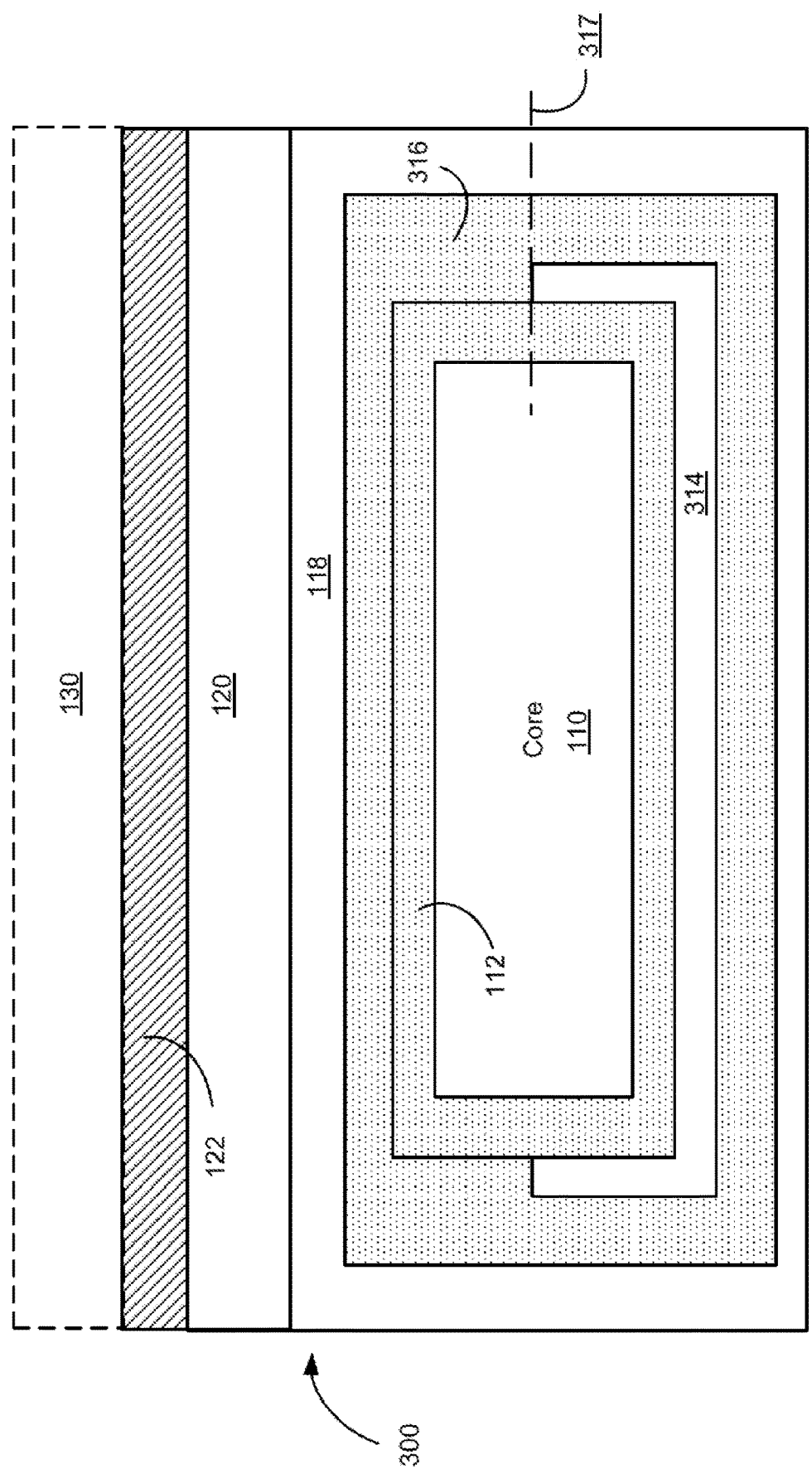
FIG. 3 is a simplified schematic diagram illustrating an engineered substrate structure according to another embodiment of the present invention.

FIG. 3 is a simplified schematic diagram illustrating an engineered substrate structure according to an embodiment of the present invention. The engineered substrate 300 illustrated in FIG. 3 is suitable for a variety of electronic and optical applications. The engineered substrate includes a core 110 that can have a coefficient of thermal expansion (CTE) that is substantially matched to the CTE of the epitaxial material 130 that will be grown on the engineered substrate 300. Epitaxial material 130 is illustrated as optional because it is not required as an element of the engineered substrate structure, but will typically be grown on the engineered substrate structure.

For applications including the growth of gallium nitride (GaN)-based materials (epitaxial layers including GaN-based layers), the core 110 can be a polycrystalline ceramic material, for example, polycrystalline aluminum nitride (AlN). The thickness of the core can be on the order of 100 to 1,500 µm, for example, 725 µm. The core 110 is encapsulated in a first adhesion layer 112 that can be referred to as a shell or an encapsulating shell. In this implementation, the first adhesion layer 112 completely encapsulates the core, but this is not required by the present invention, as discussed in additional detail with respect to FIG. 4.

In an embodiment, the first adhesion layer 112 comprises a tetraethyl orthosilicate (TEOS) layer on the order of 1,000 Å in thickness. In other embodiments, the thickness of the first adhesion layer varies, for example, from 100 Å to 2,000

Å. Although TEOS is utilized for adhesion layers in some embodiments, other materials that provide for adhesion between later deposited layers and underlying layers or materials can be utilized according to an embodiment of the present invention. For example, $SiO_2$, SiON, and the like adhere well to ceramic materials and provide a suitable surface for subsequent deposition, for example, of conductive materials. The first adhesion layer 112 completely surrounds the core 110 in some embodiments to form a fully encapsulated core and can be formed using an LPCVD process. The adhesion layer provides a surface on which subsequent layers adhere to form elements of the engineered substrate structure.

In addition to the use of LPCVD processes, furnace-based processes, and the like to form the encapsulating adhesion layer, other semiconductor processes can be utilized according to embodiments of the present invention. As an example, a deposition process, for example, CVD, PECVD, or the like, that coats a portion of the core can be utilized, the core can be flipped over, and the deposition process could be repeated to coat additional portions of the core.

A conductive layer 314 is formed on at least a portion of the first adhesion layer 112. In an embodiment, the conductive layer 314 includes polysilicon (i.e., polycrystalline silicon) that is formed by a deposition process on a lower portion (e.g., the lower half or backside) of the core/adhesion layer structure. In embodiments in which the conductive layer is polysilicon, the thickness of the polysilicon layer can be on the order of a few thousand angstroms, for example, 3,000 Å. In some embodiments, the polysilicon layer can be formed using an LPCVD process.

In an embodiment, the conductive layer 314 can be a polysilicon layer doped to provide a highly conductive material, for example, the conductive layer 314 can be doped with boron to provide a p-type polysilicon layer. In some embodiments, the doping with boron is at a level ranging from about $1\times10^{19}$ cm$^{-3}$ to $1\times10^{20}$ cm$^{-3}$ to provide for high conductivity. The presence of the conductive layer is useful during electrostatic chucking of the engineered substrate to semiconductor processing tools, for example tools with electrostatic chucks (ESC). The conductive layer 314 enables rapid dechucking after processing. Thus, embodiments of the present invention provide substrate structures that can be processed in manners utilized with conventional silicon wafers. One of ordinary skill in the art would recognize many variations, modifications, and alternatives.

A second adhesion layer 316 (e.g., a second TEOS layer) is formed surrounding the conductive layer 314 (e.g., a polysilicon layer). The second adhesion layer 316 is on the order of 1,000 Å in thickness. The second adhesion layer 316 can completely surround the conductive layer 314 as well as the first adhesion layer 112 in some embodiments to form a fully encapsulated structure and can be formed using an LPCVD process. In other embodiments, second adhesion layer 316 only partially surrounds conductive layer 314, for example, terminating at the position illustrated by plane 317, which may be aligned with the top surface of conductive layer 314. In this example, the top surface of conductive layer 314 will be in contact with a portion of barrier layer 118. One of ordinary skill in the art would recognize many variations, modifications, and alternatives.

A barrier layer 118 (e.g., a silicon nitride layer) is formed surrounding the second adhesion layer 316. The barrier layer 118 is on the order of 4,000 Å to 5,000 Å in thickness in some embodiments. In some embodiments, the barrier layer 118 completely surrounds the second adhesion layer 316 to form a fully encapsulated structure and can be formed using an LPCVD process.

In some embodiments, the use of a silicon nitride barrier layer prevents diffusion and/or outgassing of elements present in the core 110, for example, yttrium oxide (i.e., yttria), oxygen, metallic impurities, other trace elements and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments can be utilized in semiconductor process flows and clean room environments.

Figure 4:
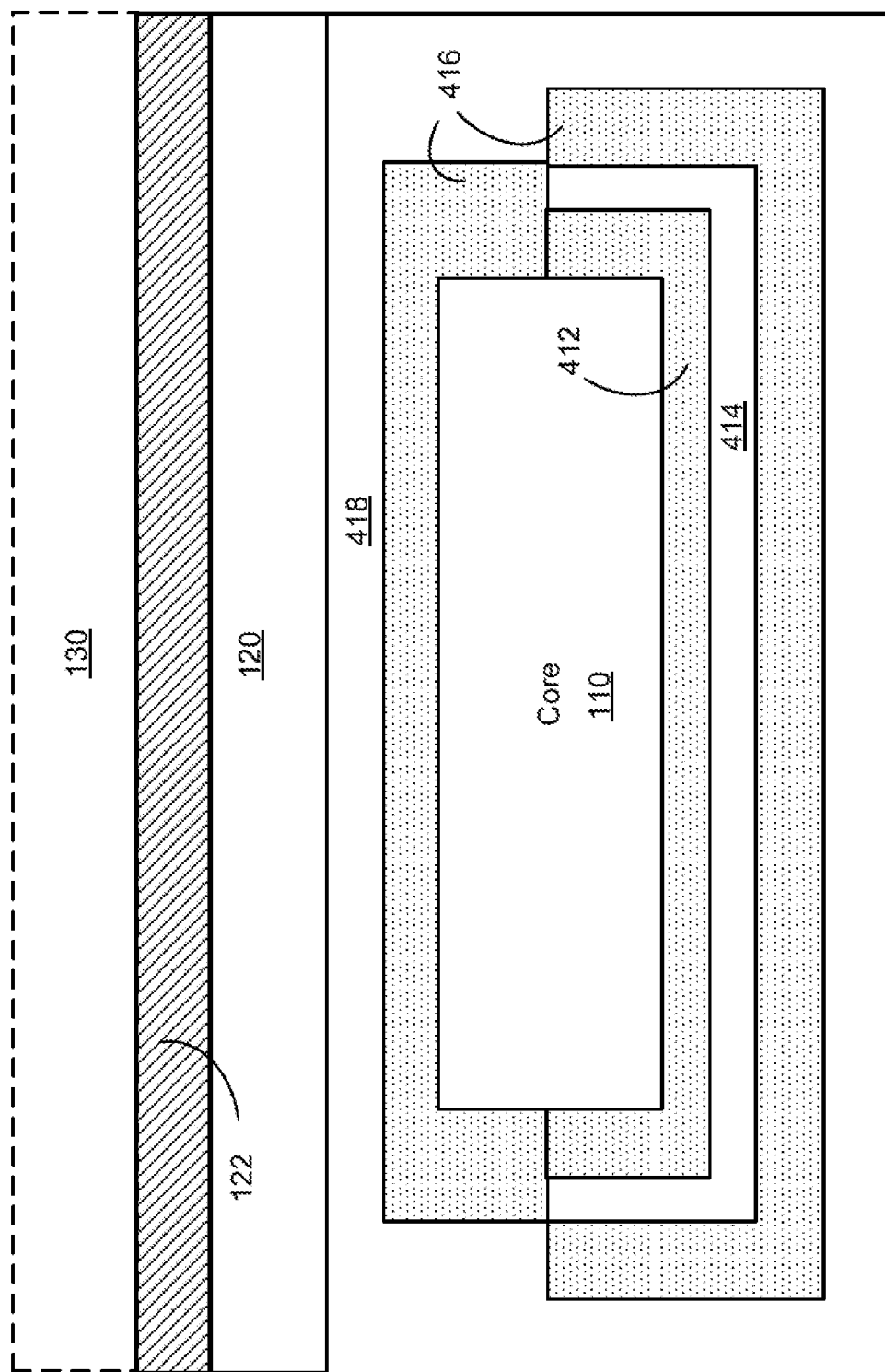
FIG. 4 is a simplified schematic diagram illustrating an engineered substrate structure according to yet another embodiment of the present invention.

FIG. 4 is a simplified schematic diagram illustrating an engineered substrate structure according to another embodiment of the present invention. In the embodiment illustrated in FIG. 4, a first adhesion layer 412 is formed on at least a portion of the core 110, but does not encapsulate the core 110. In this implementation, the first adhesion layer 412 is formed on a lower surface of the core 110 (the backside of the core 110) in order to enhance the adhesion of a subsequently formed conductive layer 414 as described more fully below. Although adhesion layer 412 is only illustrated on the lower surface of the core 110 in FIG. 4, it will be appreciated that deposition of adhesion layer material on other portions of the core will not adversely impact the performance of the engineered substrates structure and such material can be present in various embodiments. One of ordinary skill in the art would recognize many variations, modifications, and alternatives.

The conductive layer 414 does not encapsulate the first adhesion layer 412 and the core 110, but is substantially aligned with the first adhesion layer 412. Although the conductive layer 414 is illustrated as extending along the bottom or backside and up a portion of the sides of the first adhesion layer 412, extension along the vertical side is not required by the present invention. Thus, embodiments can utilize deposition on one side of the substrate structure, masking of one side of the substrate structure, or the like. The conductive layer 414 can be formed on a portion of one side, for example, the bottom/backside, of the first adhesion layer 412. The conductive 414 layer provides for electrical conduction on one side of the engineered substrate structure, which can be advantageous in RF and high power applications. The conductive layer can include doped polysilicon as discussed in relation to the conductive layer 114 in FIG. 1.

A portion of the core 110, portions of the first adhesion layer 412, and the conductive layer 414 are covered with a second adhesion layer 416 in order to enhance the adhesion of the barrier layer 418 to the underlying materials. The barrier layer 418 forms an encapsulating structure to prevent diffusion from underlying layers as discussed above.

In addition to semiconductor-based conductive layers, in other embodiments, the conductive layer 414 is a metallic layer, for example, 500 Å of titanium, or the like.

Referring once again to FIG. 4, depending on the implementation, one or more layers may be removed. For example, layers 412 and 414 can be removed, only leaving a single adhesion shell 416 and the barrier layer 418. In another embodiment, only layer 414 can be removed. In this embodiment, layer 412 may also balance the stress and the wafer bow induced by layer 120, deposited on top of layer 418. The construction of a substrate structure with insulating layers on the top side of Core 110 (e.g., with only insulating layer between core 110 and layer 120) will provide benefits for power/RF applications, where a highly insulating substrate is desirable.

In another embodiment, the barrier layer 418 may directly encapsulate core 110, followed by the conductive layer 414 and subsequent adhesion layer 416. In this embodiment, layer 120 may be directly deposited onto the adhesion layer 416 from the top side. In yet another embodiment, the adhesion layer 416 may be deposited on the core 110, followed by a barrier layer 418, and then followed by a conductive layer 414, and another adhesion layer 412.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

Figure 5:
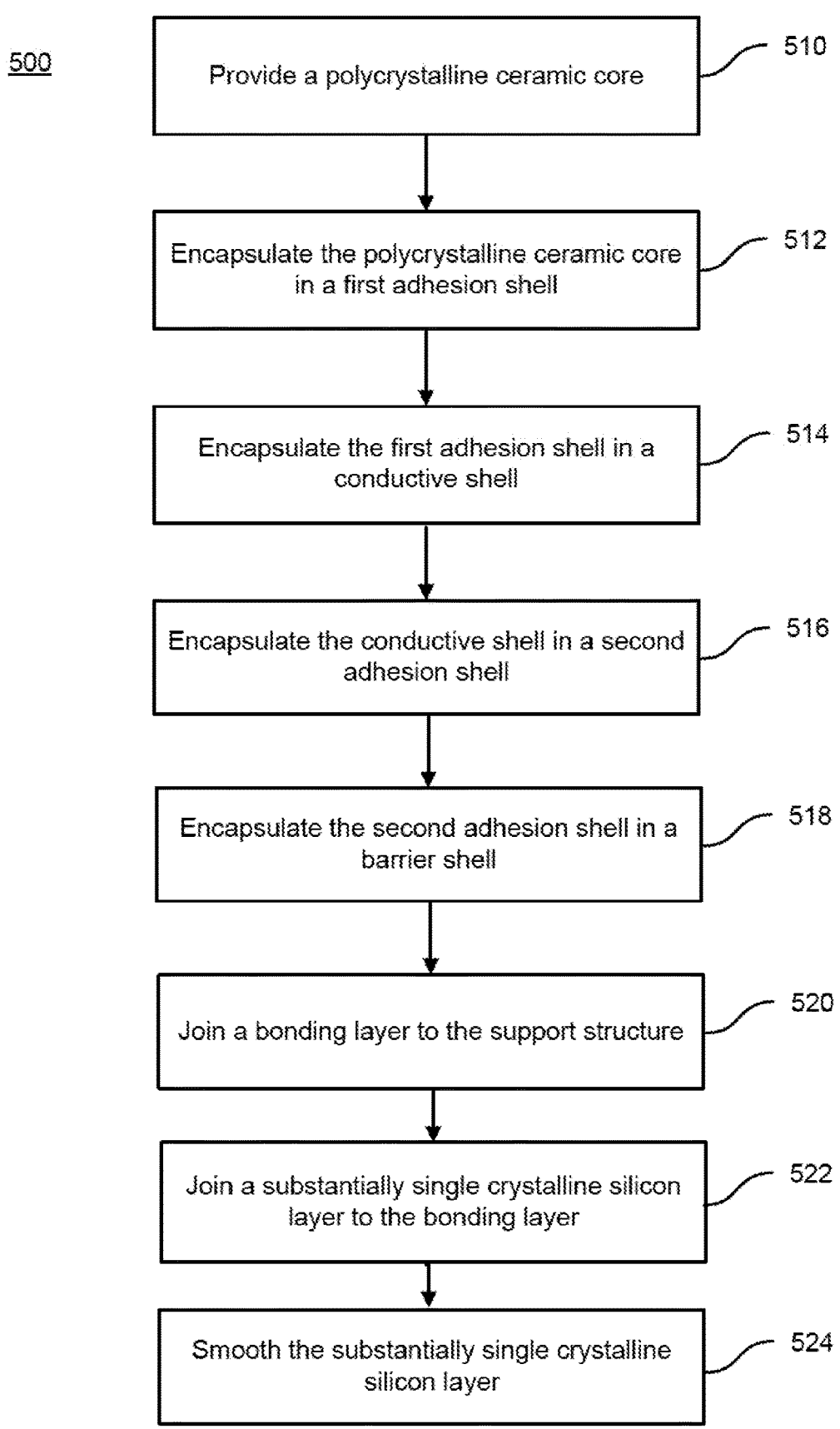
FIG. 5 is a simplified flowchart illustrating a method of fabricating an engineered substrate according to an embodiment of the present invention.

FIG. 5 is a simplified flowchart illustrating a method of fabricating an engineered substrate according to an embodiment of the present invention. The method can be utilized to manufacture a substrate that is CTE matched to one or more of the epitaxial layers grown on the substrate. The method 500 includes forming a support structure by providing a polycrystalline ceramic core (510), encapsulating the polycrystalline ceramic core in a first adhesion layer forming a shell (512) (e.g., a tetraethyl orthosilicate (TEOS) shell), and encapsulating the first adhesion layer in a conductive shell (514) (e.g., a polysilicon shell). The first adhesion layer can be formed as a single layer of TEOS. The conductive shell can be formed as a single layer of polysilicon.

The method also includes encapsulating the conductive shell in a second adhesion layer (516) (e.g., a second TEOS shell) and encapsulating the second adhesion layer in a barrier layer shell (518). The second adhesion layer can be formed as a single layer of TEOS. The barrier layer shell can be formed as a single layer of silicon nitride.

Once the support structure is formed by processes 510-518, the method further includes joining a bonding layer (e.g., a silicon oxide layer) to the support structure (520) and joining a substantially single crystalline layer, for example, a substantially single crystalline silicon layer, to the silicon oxide layer (522). Other substantially single crystalline layers can be used according to embodiments of the present invention, including SiC, sapphire, GaN, AlN, SiGe, Ge, Diamond, $Ga_2O_3$, ZnO, and the like. The joining of the bonding layer can include deposition of a bonding material followed by planarization processes as described herein. In an embodiment as described below, joining the substantially single crystalline layer (e.g., a substantially single crystalline silicon layer) to the bonding layer utilizes a layer transfer process in which the layer is a single crystal silicon layer that is transferred from a silicon wafer.

Referring to FIG. 1, the bonding layer 120 can be formed by a deposition of a thick (e.g., 4 μm thick) oxide layer followed by a chemical mechanical polishing (CMP) process to thin the oxide to approximately 1.5 μm in thickness. The thick initial oxide serves to fill voids and surface features present on the support structure that may be present after fabrication of the polycrystalline core and continue to be present as the encapsulating layers illustrated in FIG. 1 are formed. The CMP process provides a substantially planar surface free of voids, particles, or other features, which can then be used during a wafer transfer process to bond the substantially single crystalline layer 122 (e.g., a substantially single crystalline silicon layer) to the bonding layer 120. It will be appreciated that the bonding layer 120 does not have to be characterized by an atomically flat surface, but should provide a substantially planar surface that will support bonding of the substantially single crystalline layer (e.g., a substantially single crystalline silicon layer) with the desired reliability.

A layer transfer process can be used to join the substantially single crystalline silicon layer 122 to the bonding layer 120. In some embodiments, a silicon wafer (e.g., a silicon (111) wafer) is implanted to form a cleave plane. After wafer bonding, the silicon substrate can be removed along with the portion of the single crystal silicon layer below the cleave plane, resulting in the exfoliated single crystal silicon layer 122 illustrated in FIG. 1. The thickness of the substantially single crystal layer 122 can be varied to meet the specifications of various applications. Moreover, the crystal orientation of the substantially single crystal layer 122 can be varied to meet the specifications of the application. Additionally, the doping levels and profile in the substantially single crystal layer 122 can be varied to meet the specifications of the particular application.

The method illustrated in FIG. 5 may also include smoothing the substantially single crystal layer (524). In some embodiments, the thickness and the surface roughness of the substantially single crystal layer 122 can be modified for high quality epitaxial growth. Different device applications may have slightly different specifications regarding the thickness and surface smoothness of the substantially single crystal layer 122. The cleave process delaminates the substantially single crystal layer 122 from a bulk single crystal silicon wafer at a peak of an implanted ion profile. After cleaving, the substantially single crystal layer 122 can be adjusted or modified in several aspects before it is utilized as a growth surface for epitaxial growth of other materials, such as gallium nitride.

First, the transferred substantially single crystal layer 122 may contain a small amount of residual hydrogen concentration and may have some crystal damage from the implant. Therefore, it may be beneficial to remove a thin portion of the transferred substantially single crystal layer 122 where the crystal lattice is damaged. In some embodiments, the depth of the implant may be adjusted to be greater than the desired final thickness of substantially single crystal layer 122. The additional thickness allows for the removal of the thin portion of the transferred substantially single crystal layer that is damaged, leaving behind the undamaged portion of the desired final thickness.

Second, it may be desirable to adjust the total thickness of the substantially single crystal layer 122. In general, it may be desirable to have the substantially single crystal layer 122 thick enough to provide a high quality lattice template for the subsequent growth of one or more epitaxial layers but thin enough to be highly compliant. The substantially single crystal layer 122 may be said to be "compliant" when the substantially single crystal layer 122 is relatively thin such that its physical properties are less constrained and able to mimic those of the materials surrounding it with less propensity to generate crystalline defects. The compliance of the substantially single crystal layer 122 may be inversely related to the thickness of the substantially single crystal layer 122. A higher compliance can result in lower defect densities in the epitaxial layers grown on the template and enable thicker epitaxial layer growth. In some embodiments, the thickness of the substantially single crystal layer 122 may be increased by epitaxial growth of silicon on the exfoliated silicon layer.

Third, it may be beneficial to improve the smoothness of the substantially single crystal layer 122. The smoothness of the layer may be related to the total hydrogen dose, the presence of any co-implanted species, and the annealing conditions used to form the hydrogen-based cleave plane. The initial roughness resulting from the layer transfer (i.e., the cleave step) may be mitigated by thermal oxidation and oxide strip, as discussed below.

In some embodiments, the removal of the damaged layer and adjusting the final thickness of the substantially single crystal layer 122 may be achieved through thermal oxidation of a top portion of the exfoliated silicon layer, followed by an oxide layer strip with hydrogen fluoride (HF) acid. For example, an exfoliated silicon layer having an initial thickness of 0.5 µm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the substantially single crystal layer during thermal oxidation can be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for ($SiO_2$:Si). A high etch selectivity may reduce the surface roughness by a similar factor from the initial surface roughness. However, the surface roughness of the resultant substantially single crystal layer 122 may still be larger than desired. For example, a bulk Si (111) surface may have a root-mean-square (RMS) surface roughness of less than 0.1 nm as determined by a 2 µm×2 µm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 µm×30 µm AFM scan area.

If the surface roughness of the substantially single crystal layer 122 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., chemical mechanical polishing or CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 5 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
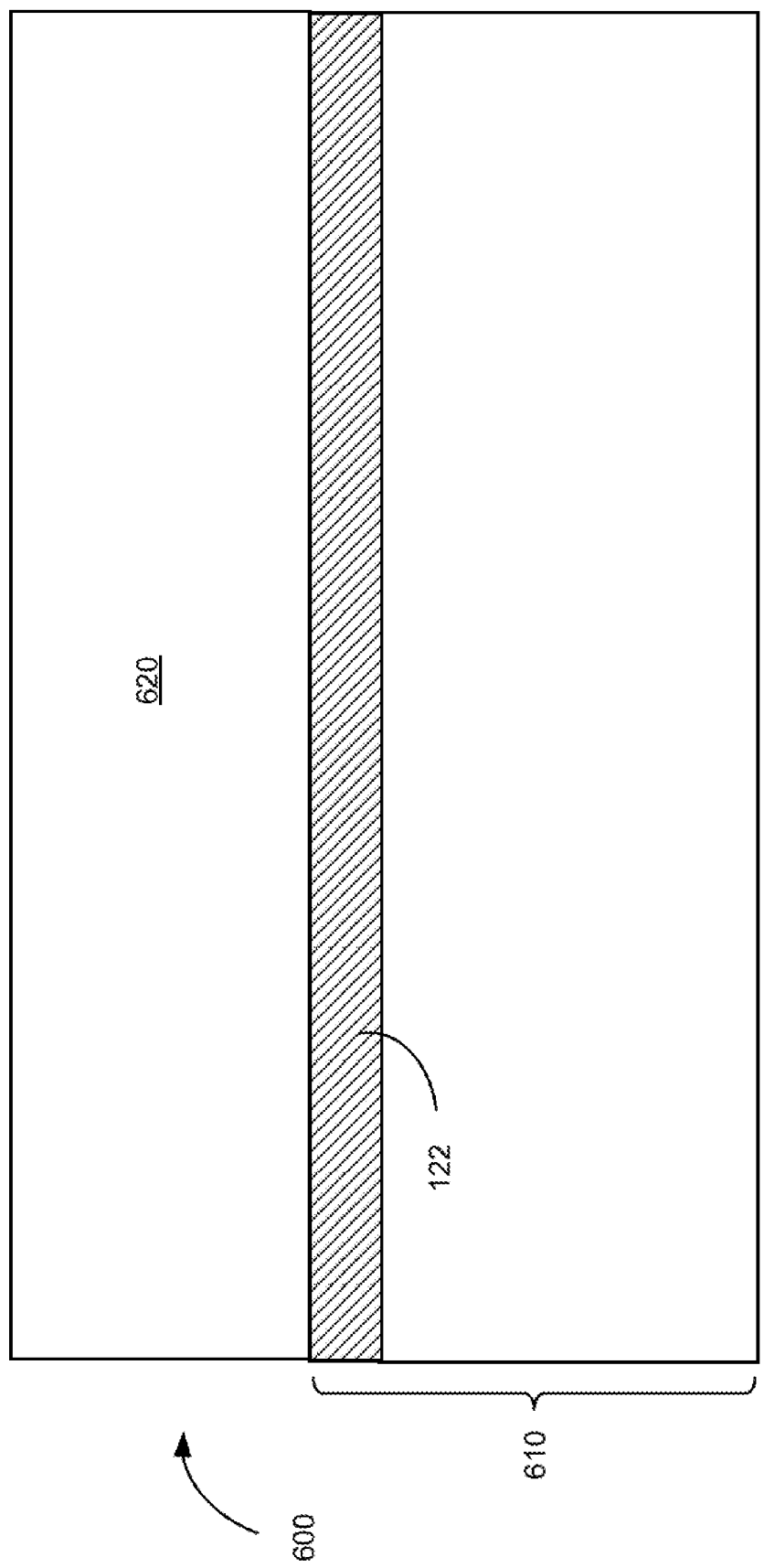
FIG. 6 is a simplified schematic diagram illustrating an epitaxial/engineered substrate structure for RF and power applications according to an embodiment of the present invention.

FIG. 6 is a simplified schematic diagram illustrating an epitaxial/engineered substrate structure for RF and power applications according to an embodiment of the present invention. In some LED applications, the engineered substrate structure provides a growth substrate that enables the growth of high quality GaN layers and the engineered substrate structure is subsequently removed. However, for RF and power device applications, the engineered substrate structure forms portions of the finished device and as a result, the electrical, thermal, and other properties of the engineered substrate structure or elements of the engineered substrate structure are important to the particular application.

Referring to FIG. 1, the single crystal silicon layer 122 is typically an exfoliated layer split from a silicon donor wafer using an implant and exfoliation technique. Typical implants are hydrogen and boron. For power and RF device applications, the electrical properties of the layers and materials in the engineered substrate structure are of importance. For example, some device architectures utilize highly insulating silicon layers with resistance greater than $10^3$ Ohm-cm to reduce or eliminate leakage through the substrate and interface layers. Other applications utilized designs that include a conductive silicon layer of a predetermined thickness (e.g., 1 µm) in order to connect the source of the device to other elements. Thus, in these applications, control of the dimensions and properties of the single crystal silicon layer is desirable. In design in which implant and exfoliation techniques are used during layer transfer, residual implant atoms, for example, hydrogen or boron, are present in the silicon layer, thereby altering the electrical properties. Additionally, it can be difficult to control the thickness, conductivity, and other properties of thin silicon layers, using, for example, adjustments in the implant dose, which can impact conductivity as well as the full width at half max (FWHM) of the implant profile, surface roughness, and cleave plane position accuracy, and implant depth, which can impact layer thickness.

According to embodiments of the present invention, silicon epitaxy on an engineered substrate structure is utilized to achieve desired properties for the single crystal silicon layer as appropriate to particular device designs.

Referring to FIG. 6, the epitaxial/engineered substrate structure 600 includes an engineered substrate structure 610 and a silicon epitaxial layer 620 formed thereon. The engineered substrate structure 610 can be similar to the engineered substrate structures illustrated in FIGS. 1, 3, and 4. Typically, the substantially single crystalline silicon layer 122 is on the order of 0.5 µm after layer transfer. Surface conditioning processes can be utilized to reduce the thickness of the single crystal silicon layer 122 to about 0.3 µm in some processes. In order to increase the thickness of the single crystal silicon layer to about 1 µm for use in making reliable Ohmic contacts, for example, an epitaxial process is used to grow epitaxial single crystal silicon layer 620 on the substantially single crystalline silicon layer 122 formed by the layer transfer process. A variety of epitaxial growth processes can be used to grow epitaxial single crystal silicon layer 620, including CVD, ALD, MBE, or the like. The thickness of the epitaxial single crystal silicon layer 620 can range from about 0.1 µm to about 20 µm, for example between 0.1 µm and 10 µm.

Figure 7:
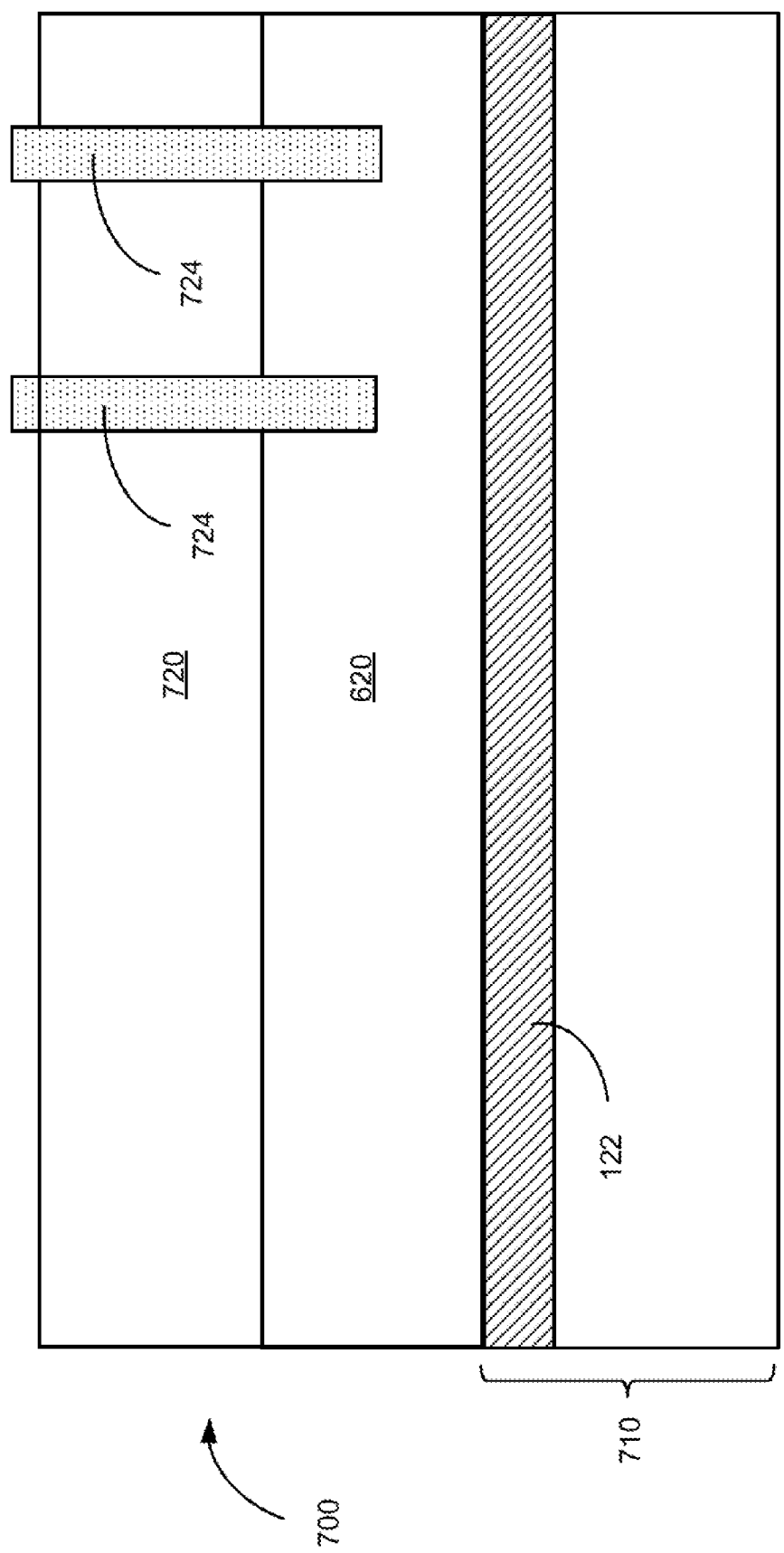
FIG. 7 is a simplified schematic diagram illustrating a III-V epitaxial layer on an engineered substrate structure according to an embodiment of the present invention.

FIG. 7 is a simplified schematic diagram illustrating a III-V epitaxial layer on an engineered substrate structure according to an embodiment of the present invention. The structure illustrated in FIG. 7 can be referred to as a double epitaxial structure as described below. As illustrated in FIG. 7, an engineered substrate structure 710 including an epitaxial single crystal silicon layer 620 has a III-V epitaxial layer 720 formed thereon. In an embodiment, the III-V epitaxial layer comprises gallium nitride (GaN).

The desired thickness of the III-V epitaxial layer 720 can vary substantially, depending on the desired functionality. In some embodiments, the thicknesses of the III-V epitaxial layer 720 can vary between 0.5 µm and 100 µm, for example, thicknesses greater than 5 µm. Resulting breakdown voltages of a device fabricated on the III-V epitaxial layer 720 can vary depending on the thickness of the III-V epitaxial layer 720. Some embodiments provide for breakdown voltages of at least 100 V, 300 V, 600 V, 1.2 kV, 1.7 kV, 3.3 kV, 5.5 kV, 13 kV, or 20 kV.

In order to provide for electrical conductivity between portions of the III-V epitaxial layer 720, which can include multiple sub-layers, a set of vias 724 are formed passing, in this example, from a top surface of the III-V epitaxial layer 720, into the epitaxial single crystal silicon layer 620. The vias 724 may be lined with an insulating layer (not shown) so that they are insulated from the III-V epitaxial layer 720. As an example, these vias could be used to connect an electrode of a diode or a transistor to the underlying silicon layer by providing an Ohmic contact through the vias, thereby relaxing charge build up in the device.

If the III-V epitaxial layer were grown on the single crystal silicon layer 122, it would be difficult to make such an Ohmic contact through the vias since terminating the via etch in the single crystal silicon layer 122 would be difficult: for example, etching through 5 µm of GaN and terminating the etch in a 0.3 µm silicon layer reliably across an entire wafer. Utilizing embodiments of the present invention, it is possible to provide single crystal silicon layers multiple microns in thickness, which is difficult using implant and exfoliation processes since achieving large implant depth requires high implant energy. In turn, the thick silicon layers enable applications such as the illustrated vias that enable a wide variety of device designs.

In addition to increasing the thickness of the silicon "layer" by epitaxially growing the single crystal silicon layer 620 on the single crystal silicon layer 122, other adjustments can be made to the original properties of the single crystal silicon layer 122, including modifications of the conductivity, crystallinity, and the like. For example, if a silicon layer on the order of 10 µm is desired before additional epitaxial growth of III-V layers or other materials, such a thick layer can be grown according to embodiments of the present invention.

Because the implant process can impact the properties of the single crystal silicon layer 122, for example, residual boron/hydrogen atoms can influence the electrical properties of the silicon, embodiments of the present invention remove a portion of the single crystal silicon layer 122 prior to epitaxial growth of single crystal silicon layer 620. For example, the single crystal silicon layer 122 can be thinned to form a layer 0.1 µm in thickness or less, removing most or all of the residual boron/hydrogen atoms. Subsequent growth of single crystal silicon layer 620 is then used to provide a single crystal material with electrical and/or other properties substantially independent of the corresponding properties of the layer formed using layer transfer processes.

In addition to increasing the thickness of the single crystal silicon material coupled to the engineered substrate structure, the electrical properties including the conductivity of the epitaxial single crystal silicon layer 620 can be different from that of the single crystal silicon layer 122. Doping of the epitaxial single crystal silicon layer 620 during growth can produce p-type silicon by doping with boron and n-type silicon by doping with phosphorus. Undoped silicon can be grown to provide high resistivity silicon used in devices that have insulating regions. Insulating layers can be of use in RF devices, in particular.

The lattice constant of the epitaxial single crystal silicon layer 620 can be adjusted during growth to vary from the lattice constant of the single crystal silicon layer 122 to produce strained epitaxial material. In addition to silicon, other elements can be grown epitaxially to provide layers, including strained layers, that include silicon germanium, or the like. For instance, buffer layers can be grown on the single crystal silicon layer 122, on the epitaxial single crystal silicon layer 620, or between layers to enhance subsequent epitaxial growth. These buffer layers could include strained III-V layers, silicon germanium strained layers, and the like. Additionally, the buffer layers and other epitaxial layers can be graded in mole fraction, dopants, polarity, or the like. One of ordinary skill in the art would recognize many variations, modifications, and alternatives.

In some embodiments, strain present in the single crystal silicon layer 122 or the epitaxial single crystal silicon layer 620 may be relaxed during growth of subsequent epitaxial layers, including III-V epitaxial layers.

Figure 8:
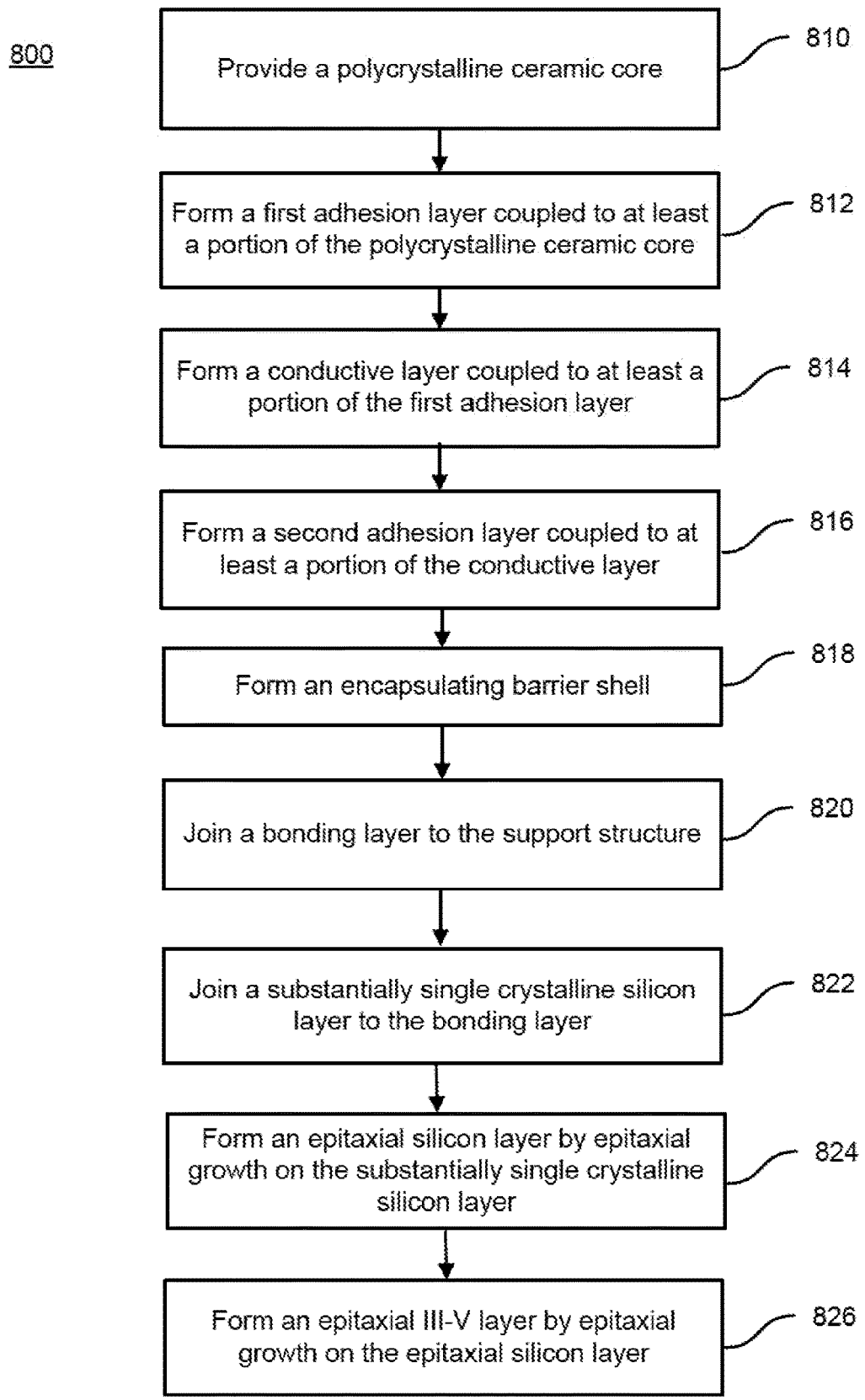
FIG. 8 is a simplified flowchart illustrating a method of fabricating an engineered substrate according to another embodiment of the present invention.

FIG. 8 is a simplified flowchart illustrating a method of fabricating an engineered substrate according to another embodiment of the present invention. The method includes forming a support structure by providing a polycrystalline ceramic core (810), forming a first adhesion layer coupled to at least a portion of the polycrystalline ceramic core (812). The first adhesion layer can include a tetraethyl orthosilicate (TEOS) layer. The method also includes forming a conductive layer coupled to the first adhesion layer (814). The conductive layer can be a polysilicon layer. The first adhesion layer can be formed as a single layer of TEOS. The conductive layer can be formed as a single layer of polysilicon.

The method also includes forming a second adhesion layer coupled to at least a portion of the conductive layer (816), and forming a barrier shell (818). The second adhesion layer can be formed as a single layer of TEOS. The barrier shell can be formed as a single layer of silicon nitride or a series of sub-layers forming the barrier shell.

Once the support structure is formed by processes 810-818, the method further includes joining a bonding layer (e.g., a silicon oxide layer) to the support structure (820) and joining a substantially single crystalline silicon layer or a substantially single crystal layer to the silicon oxide layer (822). The joining of the bonding layer can include deposition of a bonding material followed by planarization processes as described herein.

A layer transfer process can be used to join the substantially single crystalline silicon layer 122 to the bonding layer 120. In some embodiments, a silicon wafer (e.g., a silicon (111) wafer) is implanted to form a cleave plane. After wafer bonding, the silicon substrate can be removed along with the portion of the single crystal silicon layer below the cleave plane, resulting in the exfoliated single crystal silicon layer 122 illustrated in FIG. 1. The thickness of the substantially single crystalline silicon layer 122 can be varied to meet the specifications of various applications. Moreover, the crystal orientation of the substantially single crystal layer 122 can be varied to meet the specifications of the application. Additionally, the doping levels and profile in the substantially single crystal layer 122 can be varied to meet the specifications of the particular application. In some embodiments, the substantially single crystalline silicon layer 122 can be smoothed, as described above.

The method illustrated in FIG. 8 may also include forming an epitaxial silicon layer by epitaxial growth on the substantially single crystalline silicon layer (824), and forming an epitaxial III-V layer by epitaxial growth on the epitaxial silicon layer (826). In some embodiments, the epitaxial III-V layer may comprise gallium nitride (GaN).

It should be appreciated that the specific steps illustrated in FIG. 8 provide a particular method of fabricating an engineered substrate according to another embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing a substrate, the method comprising:
   forming a support structure by:
      providing a polycrystalline ceramic core;
      forming a first adhesion layer coupled to the polycrystalline ceramic core;
      forming a conductive layer coupled to the first adhesion layer;
      forming a second adhesion layer coupled to the conductive layer; and
      forming a barrier layer coupled to the second adhesion layer;
   forming a bonding layer coupled to the support structure;
   joining a substantially single crystalline silicon layer to the bonding layer; and
   forming one or more epitaxial III-V layers coupled to the substantially single crystalline silicon layer.

2. The method of claim 1 wherein the polycrystalline ceramic core comprises aluminum nitride.

3. The method of claim 2 wherein the one or more epitaxial III-V layers comprise an epitaxial gallium nitride layer.

4. The method of claim 3 wherein the epitaxial gallium nitride layer has a thickness of about 5 µm or greater.

5. The method of claim 3 wherein the one or more epitaxial III-V layers further comprise an epitaxial aluminum nitride layer, or an epitaxial aluminum gallium nitride layer, or a combination thereof.

6. The method of claim 1 wherein joining the substantially single crystalline silicon layer is performed by exfoliation.

7. The method of claim 6 further comprising, before forming the one or more epitaxial III-V layers:
   forming an epitaxial silicon layer coupled to the substantially single crystalline silicon layer;
   wherein the one or more epitaxial III-V layers are coupled to the epitaxial silicon layer.

8. The method of claim 7 wherein the epitaxial silicon layer is strained.

9. The method of claim 1 wherein:
   the first adhesion layer comprises tetraethyl orthosilicate (TEOS);
   the conductive layer comprises polysilicon;
   the second adhesion layer comprises TEOS;
   the barrier layer comprises silicon nitride; and
   the bonding layer comprise silicon oxide.

10. The method of claim 9 wherein:
   the first adhesion layer encapsulates the polycrystalline ceramic core;
   the conductive layer encapsulates the first adhesion layer;
   the second adhesion layer encapsulates the conductive layer; and
   the barrier layer encapsulates the second adhesion layer.

* * * * *